United States Patent [19]
Hanlon et al.

[11] 4,391,408
[45] Jul. 5, 1983

[54] LOW INSERTION FORCE CONNECTOR

[75] Inventors: Richard J. Hanlon, Attleboro, Mass.; Rudi O. H. Vetter, Pawtucket, R.I.

[73] Assignee: Augat Inc., Attleboro, Mass.

[21] Appl. No.: 184,216

[22] Filed: Sep. 5, 1980

[51] Int. Cl.³ .................................... H01R 13/639
[52] U.S. Cl. ........................ 339/75 M; 339/17 CF
[58] Field of Search ............... 339/17 L, 17 CF, 179, 339/75 MP, 75 M, 221 R

[56] References Cited

U.S. PATENT DOCUMENTS

| | | | |
|---|---|---|---|
| 3,464,054 | 8/1969 | Mansfield | 339/176 X |
| 3,920,303 | 11/1975 | Pittman et al. | 339/91 R |
| 4,054,347 | 10/1977 | Mouissie | 339/75 M |
| 4,060,296 | 11/1977 | Kunille et al. | 339/217 R X |
| 4,080,032 | 3/1978 | Cherian et al. | 339/17 CF X |
| 4,169,644 | 10/1979 | Bonhomme | 339/75 MP |
| 4,266,840 | 5/1981 | Seidler | 339/75 M |

*Primary Examiner*—Eugene F. Desmond
*Attorney, Agent, or Firm*—Weingarten, Schurgin, Gagnebin & Hayes

[57] ABSTRACT

A low or zero insertion force connector for mounting integrated circuit (IC) packages or other multiple pin devices to electrical interconnection boards. A base member has a plurality of spring contacts along opposite long sides which are coupled to actuating members. A slide is connected by pin and slot camming means to the actuators so that longitudinal motion of the slide causes lateral motion of the actuators. Movement of the actuators in one direction draws the contacts inwardly to provide a clear path for the IC leads to be inserted adjacent the contacts. A cover is provided upon which the IC is seated and which has tapered openings to receive the IC leads in alignment with the contacts.

14 Claims, 8 Drawing Figures

LOW INSERTION FORCE CONNECTOR

FIELD OF THE INVENTION

This invention relates generally to electrical interconnection devices, and more particularly concerns a connector employed as an interface between a multiple terminal electronic device, such as an integrated circuit, and an electrical interconnection or printed circuit board. The purpose of the invention is to substantially reduce the insertion force of the integrated circuit terminals into the connector.

DISCUSSION OF THE PRIOR ART

The terminals or leads of electronic devices such as integrated circuits (IC) are relatively delicate and easily deformed. Furthermore, the connection of a terminal to the interior circuitry of an IC can easily be disturbed by applying excessive force to the terminal. An IC may have a relatively large number of terminals along one edge and the greater the number, the greater the amount of force necessary to insert and remove the IC from a frictionally engaging connector. Thus, it is possible that the IC itself could be damaged by the stresses imparted to the body thereof when forces are applied to insert or remove it.

Many attempts have been made to provide a low or zero insertion force connector so that a multiple terminal IC may be pluggably coupled to an interconnection board where the insertion and retraction forces on each IC terminal are minimal. One example of a device of this type is disclosed in U.S. Pat. No. 4,080,032. This patent shows a draw bar having a ramp and slot configuration meshing with ramp and slot configured actuators which engage one arm of double arm spring contact members. By moving the draw bar longitudinally in one direction, the actuators separate the two arms of the double arm spring contact members to permit IC terminals to be easily inserted between the arms. Longitudinal movement of the draw bar in the opposite direction releases the actuators so that the spring contacts return by their own spring action to the normally closed condition and at the same time returns the actuators to their unactuated, normal or ON position. This device employs a relatively complex structure in that the ramp and slot configuration is somewhat complex, as is the double arm spring contact member. Furthermore, the actuators return to their normal or ON position due to impetus of the spring action of the contact members, that is, there is no positive return force on the actuators.

SUMMARY OF THE INVENTION

It is an objection of this invention to provide a simplified, reduced cost, low insertion force connector for multiple pin IC's. The connector provides for positive motion of the actuators to both the ON and OFF positions.

The connector of this invention is formed of a base member having a plurality of open sided slots along each opposite long edge for receiving and retaining a spring loaded contact member. The contact member is formed with a cantilevered hook portion which engages a transversely movable actuator which is in turn engaged by a slide. When the slide moves longitudinally, the actuator, through a pin and slot camming arrangement, moves transversely with respect to the longitudinal axis of the connector. This transverse motion translates the bearing surface of the contacts from a position of engagement to a position of disengagement with the terminals of the integrated circuit. A cover member provides individual tapered openings for the IC terminals and a bearing surface for the outside surface of each such terminal as the inside surface of the terminal is normally engaged by the bearing surface of the contact member. While the top portion of the contact member is spring loaded and is laterally movable for a limited distance, the bottom portion of the contact member is fixed within the slot in the base member.

BRIEF DESCRIPTION OF THE DRAWING

The objects, advantages and features of this invention will be more clearly appreciated from the following detailed description when taken in conjunction with the accompanying drawing in which.

DESCRIPTION OF THE PREFERRED EMBODIMENT

Figure 1:
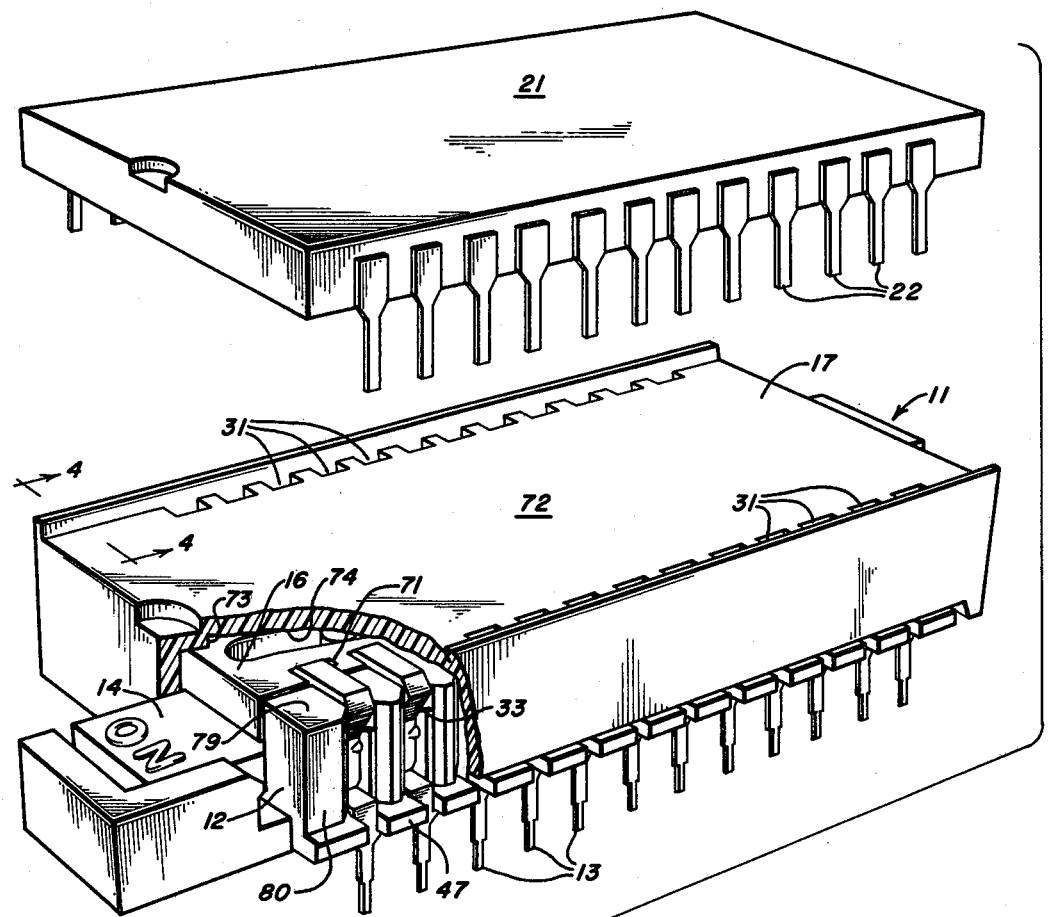
FIG. 1 is a perspective, partially broken away view of the connector of this invention.
Figure 2:
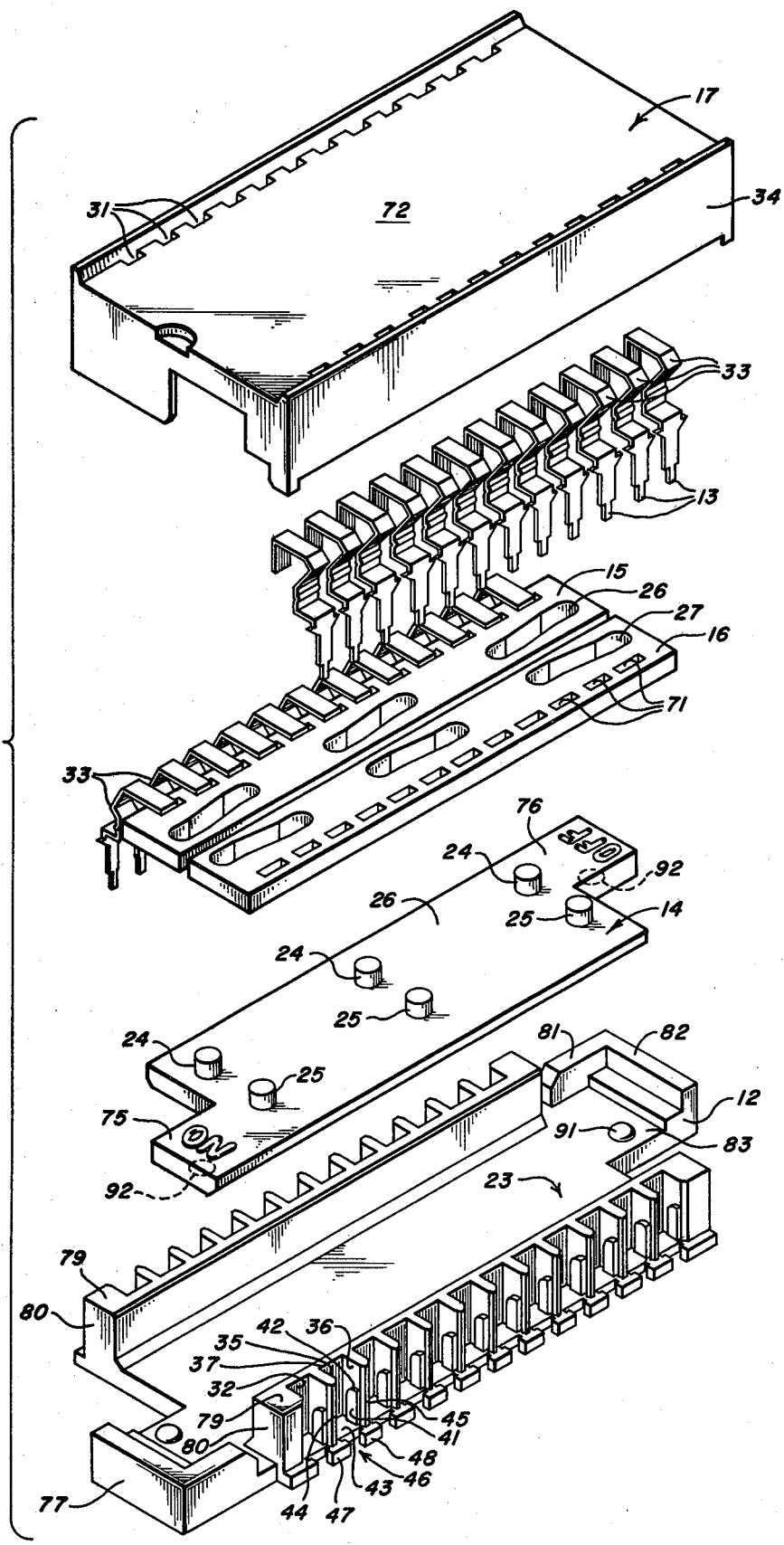
FIG. 2 is an exploded perspective view of the connector FIG. 1.

With reference now to the drawing and more particularly to FIGS. 1 and 2 thereof, there is shown a connector 11 comprised of base member 12, contact members 13, slide 14, actuators 15 and 16 and cover 17. A typical integrated circuit device 21 having terminals 22 projecting downwardly from one surface thereof in a dual-in-line configuration, which the connector of this invention is adapted to pluggably receive, is also shown.

Slide 14 resides in centrally located recess 23 in body 12. The width of the slide is substantially the same as the width of the recess but the slide moves freely within predetermined limits in the longitudinal direction. The slide is formed with a plurality of pegs 24, 25 arranged in two rows and projecting upwardly from the top surface 26 thereof. Two similar actuators 15, 16 are formed with elongated slots 26, 27 respectively which loosely engage pegs 24 and 25 respectively. With slots 26, 27 arranged at similar but opposite angles with respect to the longitudinal axis of the connector as shown in FIG. 2, it is easily perceived that longitudinal motion of slide 14 will cause lateral motion of actuators 15 and 16. The purpose and effect of this lateral motion will be fully described hereinbelow.

Cover 17 encloses the top and sides of base 12 and serves to confine the slide and actuators between the cover and the recess of the base, to limit the longitudinal motion of the slide and to prevent longitudinal motion of the actuators. The cover has a plurality of spaced openings 31 in two rows along opposite edges of the top surface thereof, the openings being adapted to receive the terminals of IC 21. Along the two opposite long edges of base 12 are formed a plurality of open sided slots 32 specifically formed and adapted to receive contact members 13. The structure of FIGS. 1 and 2 is so configured that when terminals 22 of IC 21 are fully inserted through openings 31 in cover 17, these terminals overlie an outward facing bearing surface 33 of the contact members. The terminals are also confined by the interior surface of sides 34 of the cover. As will be appreciated from the following description, a very low insertion or retraction force is necessary to mount IC 21 to or remove it from connector 11 when the connector is in its OFF condition but the terminals of the IC are positively engaged by the contact members 13 when the connector is in the ON condition.

Figure 3:
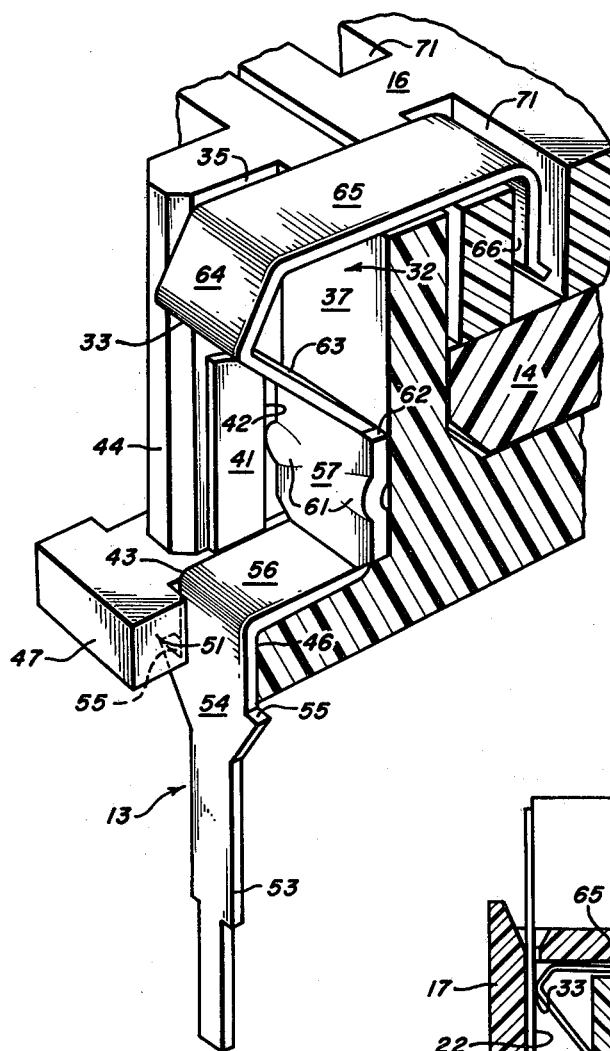
FIG. 3 is an enlarged perspective view of a contact member in a slot in the connector of FIG. 1.

With reference now to FIGS. 2-5, and specifically to FIG. 3, there is shown the detail of contact member 13 and slot 32 in which it is mounted. The main portion of slot 22 is a relatively clear, rectangularly shaped space having facing vertical side walls 35 and 36 and a vertical back wall 37 interconnecting the side walls. Each side wall is formed with a projecting surface 41 having a rearward facing shoulder 42 spaced from the back wall. The side and back walls are interconnected by a bottom shelf 43 which extends outwardly beyond the ends 44, 45 respectively of the side walls and form a T-shaped or dove tail opening 46 between T-shaped end blocks 47, 48. The end blocks have confronting spaced facing surfaces 51, 52 respectively. The contact member which is shown individually in a slot 32 in enlarged detail in FIG. 3 is adapted to be seated firmly within the slot in a spring loaded condition. A downwardly projecting and relatively narrow terminal portion 53 is connected to a somewhat enlarged portion 54 formed with two oppositely directed barbs 55 which engage the wide portions of T-shaped slot 46 so as to displace some of the material surrounding that slot upon insertion of the contact member therein. This provides positive mounting of the bottom portion of the contact member to the base. Lateral portion 56 is formed to overlie the interior portion of shelf 43 of the slot and is oriented at substantially a right angle with respect to terminal portion 53. The widest portion of the contact member is spade 57 which is substantially parallel to terminal portion 53 and is also oriented at substantially a right angle with respect to lateral portion 56. The spade is formed with spaced matching forward projecting deformities or rounded portions 61 generally centrally located with respect to the vertical dimension of the spade.

Upon insertion of the contact member into slot 32, the widened portions or wings 62 of the spade occupy the space in the slot between shoulder 42 of projection 41 and back wall 37. Rounded portion 61 makes the effective thickness of the contact somewhat greater than the distance between shoulder 42 and the back wall so that there is an interference fit and the spade portion of the contact member is firmly seated in the slot against the back wall thereof. The spring portion of the contact member projects generally upwardly from the spade portion and is comprised of forwardly angled portion 63 connected to rearwardly angled portion 64, top lateral portion 65 and finally downwardly projecting hook portion 66. Bearing surface 33 provides the transition between angled portions 63 and 64 and normally, when the connector is in the ON condition, it extends outwardly beyond edges 44 and 45 of side walls 35 and 36. Top lateral portion 65 extends back beyond back wall 37 and engages substantially rectangular slot 71 in actuator 16. Note that both actuators have a row of slots 71 corresponding and aligned with each of slots 32 in the base. Hook portion 66 of the contact member engages slot 71 for lateral motion therewith.

Figure 4B:
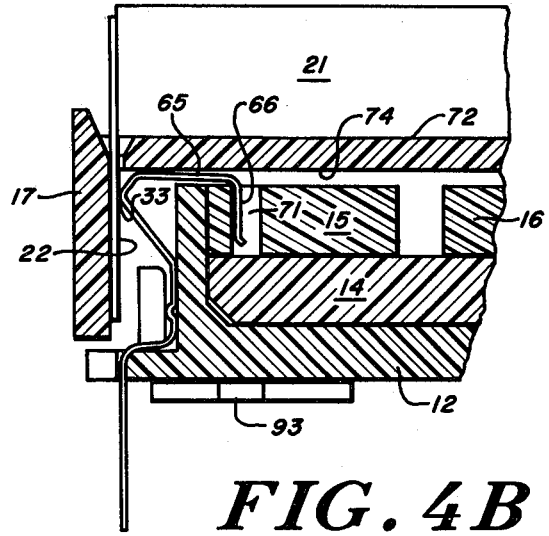
FIG. 4B is a view similar to FIG. 4A showing the connector in the ON position.

To change the position of the connector between ON and OFF, slide 14 is moved longitudinally. The effect of this longitudinal motion is readily perceived from FIGS. 4 and 5. FIGS. 4B and 5B show the connector in the ON condition with contact bearing surfaces 33 projecting beyond end surfaces 44 and 45 of the side walls of slots 32. At this position, actuators 15 and 16 are spaced apart and substantially abutting the opposite side walls of recess 23. This allows contact members 13 to be in the normal ON condition as previously described. Longitudinal motion of slide 14 to the OFF position results in longitudinal motion of pins 24, 25 in slots 26, 27 in a camming action. Because the actuators are confined by cover 17 they cannot move longitudinally and therefore must move laterally pursuant to that camming action. Upon such longitudinal motion of the slide, the actuators move toward one another and away from the side walls of recess 23, thereby pulling the top portions of the contact members away from the normal or ON position and moving bearing surfaces 33 of the contact member inwardly to a position where they are even with or inside the plane of edges 44 and 45 of the slot walls. Movement of the slide in the opposite direction causes the actuators to move outwardly by similar camming action and the contact members thereby return by means of their own built-in spring configuration to the normal or ON condition with the bearing surface 33 extending out beyond the sides of the slots in the base.

Figure 4A:
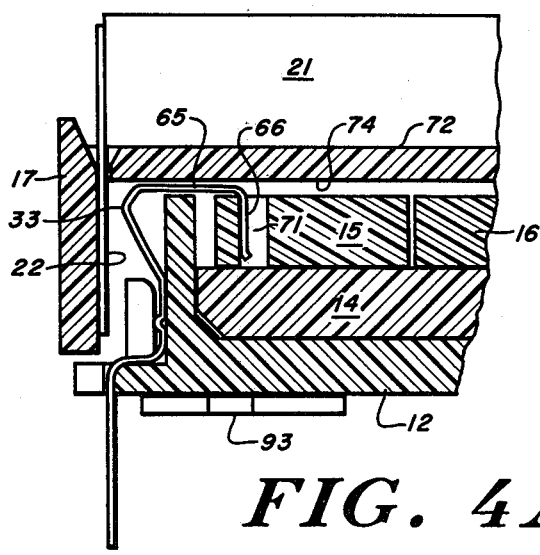
FIG. 4A is an enlarged partial sectional view taken along cutting plane 4—4 of FIG. 1, showing the connector in the OFF position.
Figure 5A:
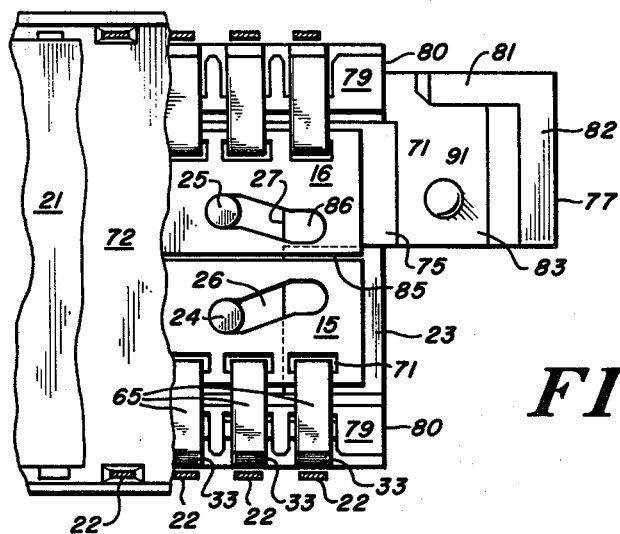
FIG. 5A is a partial top view of the actuators showing them in the OFF position.
Figure 5B:
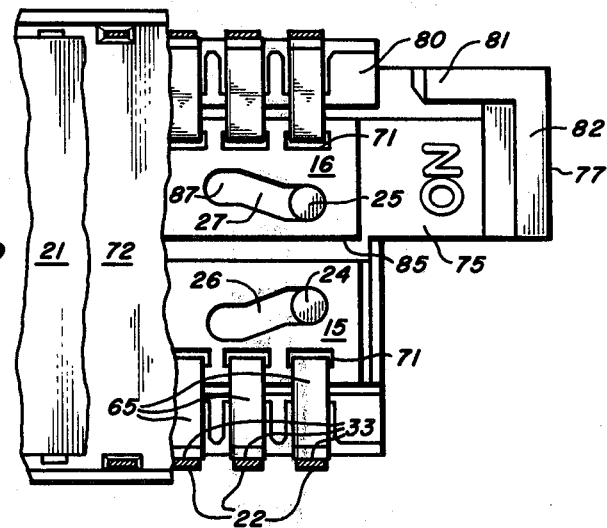
FIG. 5B is a view similar to FIG. 5A showing the actuators in the ON position.

The OFF condition just described is shown clearly in FIGS. 4A and 5A.

When the connector is assembled to the combination of the base, slide, actuators and contact members, the contacts will normally be in their ON position as shown in FIG. 4B with the actuators spaced apart and the inside surfaces of sides 34 will normally be close to or touch contact bearing surfaces 33. Thus, when the connector is in the ON condition, bearing surfaces 33 normally are in contact with the inside surfaces of sides 34 of the cover. The inside surface 74 of the top 72 of the cover will normally be slightly clear of or lightly engaging the tops of pins 24, 25, confining the actuator and slide within recess 23 in the base. Stand off bars 73 are provided in the upper inside ends of the cover and rest upon the top surfaces 79 of the base corners. These stand offs are somewhat higher than is the thickness of contact members 13 so that there is no interference between inside surface 74 of the cover and the lateral motion of the contacts when slide 14 is moved longitudinally. The cover is ultrasonically welded to the base and additional base or cover material is provided at appropriate locations to function as energy directors. These are not material to the invention and are not shown in the drawing. They could be formed as bars of material on the top or sides of the base corner posts 80, or as pads of material on the upper inside corners of the cover. A conventional ultrasonic process fixes the cover to the base.

As is apparent from FIG. 4, openings 31 along the edges of top 72 of cover 17 have tapered entries, normally in the range of 30° on either side. These tapered openings facilitate entry of terminals 22 of IC 21 into the connector. Normally the terminals will be angled somewhat outwardly away from the edges of the IC and in that case, the outside tapered portion of the openings will draw the terminals inwardly such that they then slide down the inside surface of sides 34 between that surface and bearing surface 33 of the contact member. In order to provide a very low insertion force, the slide 14 is moved to the OFF position drawing the actuators and consequently the contact members inwardly so that there is little or no interference between bearing surface 33 and entering terminals 22. When the IC rests on top 72 of cover 17, the terminals will be in the position shown in FIGS. 4A and 4B and with the connector in the OFF condition, FIG. 4A is applicable. The slide is then moved to the ON position, actuators 15 and 16 move outwardly away from each other, the bearing surface abuts the terminal 22 and the terminal is thereby confined between the inside surface of side 34 of the cover and the bearing surface of the contact member (see FIG. 4B).

Figure 6:
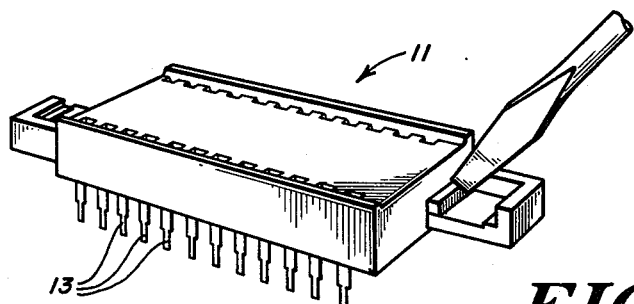
FIG. 6 is a partial perspective view showing the slide being actuated from one position to another.

With reference to FIG. 6 it is shown that slide 14 may be easily moved longitudinally by means of a common screw driver. Extensions 75 and 76 which are labeled ON and OFF respectively of slide 14, are confined within extensions 77 and 78 of base 12, respectively. The extensions are formed with upright walls 81 and 82 defining an extension 83 of recess 23. The longitudinal motion of the slide is defined by the ends of the cover and coincides with the length of slots 26, 27 in actuators 15, 16. The limits of the motion of the slide is such that the end of extension 75 never reaches the inside surface of wall 82 of the extension of the base member. The same is true of extension 76 of the slide. Thus there is always a gap between the end of the extension of the slide and wall 82 defining the end of extension 83, to thereby facilitate actuation by a screwdriver. This gap is shown clearly in FIG. 5. To facilitate positive engagement of slide 14 in the ON or OFF positions, extensions 83 are formed with an upstanding bump 91 and slide 14 is formed with a mating depression 92.

With specific reference to FIGS. 5A and 5B, the contour of slots 26 and 27 may be seen. Slots 27 of actuator 16 are arranged generally angled from slots 71 toward inside edge 85. However, a first dwell portion 86 is formed at the lower end of slot 27, and a second dwell portion 87 is formed at the upper end. When the slide is moved to the ON position, pin 25 enters dwell portion 86. The dwell portion is either parallel with edge 85 or angled somewhat toward it so that handling and vibrations will not cause the connector to inadvertently move from its ON position until slide 14 is intentionally moved. The same is true of dwell portion 87 which retains pin 25 when the connector is in the OFF condition. The angle of the dwell portions 86 and 87 with respect to edge 85 is preferably between 0° and 5°. Actuator 15 is formed with similar shaped slots 26, arranged in the opposite orientation as shown in FIG. 5. It should be noted that this connector is operable without slots 26 and 27 having dwell portions. Further, if dwell portions are used, they need not have the particular configurations shown.

For purposes of example only, the materials from which the elements of the connector are made will be set forth. All but the contact members are molded of a thermoplastic polyester and a suitable material for making the plastic members is sold under the trade name of Valox. The basic requirement of the plastic is that it be readily moldable and be substantially rigid. The contact members are normally made of beryllium copper with tin lead plating or selective gold plating, that is, on bearing surface 33.

While the drawing and description have concerned themselves with the connector having downwardly extending terminals 13 adapted to enter holes in a printed circuit or other type of electrical interconnection board and be soldered therein, the terminals may be bent either outwardly or inwardly as they extend below the connector, for surface mounting to pads arranged in dual-in-line arrays on such an interconnection board. This difference in mounting would have no bearing upon the invention. For either configuration, base 12 is formed with downwardly projecting stand offs 93 (see FIG. 4). This insures clearance between the bottom of the connector and the surface of the circuit board to facilitate cleaning after installation of the connector to the board.

In view of the above description, it is likely that modifications and improvements will occur to those skilled in the art which are within the scope of the invention.

What is claimed is:

1. A low insertion force connector for an integrated circuit package having a plurality of terminals arranged in spaced parallel rows, said connector comprising:
   a rectangular base member formed with a plurality of apertures along opposite edges thereof;
   a spring loaded electrically-conductive contact member mounted in each of said apertures, said contact member having only one bearing surface adapted to move without flexure of the bearing surface to coact with an electrically non-conductive surface of a cover to make a single-sided contact with an inserted terminal, said bearing surface having a normal ON position and an OFF position;
   a slide member on said base, said slide member being longitudinally movable and having a plurality of upstanding pins on its top surface;
   a pair of actuator members on said slide member, each actuator member associated with a different plurality of said apertures, said actuator members having a plurality of elongated first slots arranged at an angle with respect to the direction of longitudinal movement of said slide member, each of said first slots engaging a corresponding pin, said actuators being laterally movable with respect to said base member and said slide member; and
   an electrically non-conductive cover engaging said base and enclosing said slide, actuators and a portion of said contact members including said bearing surfaces, said cover being formed with a plurality of openings aligned with said apertures and said contact members in said apertures, said cover being further formed with electrically non-conductive surfaces confronting said contact members and said apertures in said base;
   said actuators each having a plurality of second slots arranged in a row along one edge thereof, each of said contact members being formed with a hook portion engaging a corresponding one of said second slots;
   whereby longitudinal movement of said slide member in one direction moves said actuators away from each other to the normal or ON position whereby said bearing surfaces of said contact members are closely adjacent said confronting surfaces of said cover, and longitudinal movement of said slide in a second direction moves said actuators toward each other to the OFF position whereby said bearing surfaces are moved laterally away from said confronting surfaces of said cover; and whereby the terminals of said integrated circuit package may be easily inserted through said openings and between said bearing surfaces and said confronting surfaces when said connector is in the OFF condition and the terminals are positively confined between said bearing surfaces and said confronting surfaces when said connector is in the ON condition.

2. The connector recited in claim 1 wherein:
each of said apertures in said base member is formed with spaced opposed side walls interconnected by a rear wall and a bottom shelf, thereby defining a generally rectangular channel with an open top and an open front, said shelf extending forwardly of the edges of said side walls and being formed with a T-shaped slot with the narrow portion of said T-shaped slot opening outwardly, at least a portion of said T-shaped slot being defined by T-shaped extensions on said shelf aligned with and extending beyond the edges of said side walls;

said contact member being formed with a downwardly extending terminal portion having laterally projecting barbs adapted for interference fit with the wide portion of said T-shaped slot.

3. The connector recited in claim 2 wherein said contact member is further formed with a lateral portion overlying said shelf, an enlarged vertical portion positioned closely adjacent said rear wall, a portion projecting forwardly at an angle from said vertical portion, a portion projecting rearwardly at an angle from said forward projection, a rearward lateral extension and said hook portion projecting downwardly from said lateral extension, the top portion of said contact member comprising said forward and rearward angular portions and said lateral extension being spring loaded and deformably connected to said vertical portion, said bearing surface being the transitional surface between said forward angular portion and said rearward angular portion.

4. The connector recited in claim 3 wherein said top portion of said contact member is movable with lateral movement of said actuators to thereby move said bearing surface toward and away from said confronting surfaces of said cover.

5. The connector recited in claim 3 wherein:
said side walls of said apertures are each formed with an inward projection defining a shoulder spaced from said rear wall;
the opposite edges of said enlarged vertical portion of said contact member being confined between said rear wall and said shoulder.

6. The connector recited in claim 5 wherein said enlarged vertical portion of said contact member has a forwardly projecting rounded section effectively making said vertical portion thicker whereby said vertical portion is in an interference fit between said rear wall and said shoulders.

7. The connector recited in claim 1 wherein said base member is formed with extensions on either end enclosing the ends of said slide member.

8. The connector recited in claim 7 wherein:
said base member is formed with a central recess having side walls adjacent said slots, said extensions having upstanding end walls;
said slide member is formed with extensions on either end;
said recess extending to said upstanding end walls on either end of said base;
said slide member extensions being spaced from said upstanding end walls in both the ON and OFF positions to permit an actuating tool to be inserted between said upstanding end walls and said slide extensions.

9. The connector recited in claim 1 wherein each of said first slots in said actuators is formed with a dwell portion at either end arranged at an angle with respect to the axis of said slots, whereby each of said upstanding pins on said slide reside in one of said dwell portions when said connector is in the ON condition and in the other dwell portions when said connector is in the OFF condition.

10. The connector recited in claim 1 wherein when said slide member moves in one direction, said pins engage first sides of said first slots in said actuators to move said actuators laterally to the ON position, and when said slide member moves in the other direction, said pins engage second sides of said first slots in said actuators to move said actuators laterally to the OFF position.

11. The connector recited in either claim 1 or 4 wherein one of said cover and base member is formed with means to prevent the inside surface of the top of said cover from interfering with movement of said top portion of said contact.

12. The connector recited in claim 11 wherein said interference preventing means comprises internal projection on said cover, said internal projection engaging the top of said base member.

13. The connector recited in claim 1 wherein said base is formed with downwardly extending projections adapted to engage the surface of a member to which said connector is mounted and maintain the body of said connector in a spaced relationship with respect to said surface.

14. The connector recited in claim 8 wherein:
said slide member extensions are formed with depressions on the under side facing said recess;
said recess extensions are formed with a projection adapted to selectively mate with said depression when said slide is in either the ON or OFF position.

* * * * *